United States Patent [19]
Mori et al.

[11] Patent Number: 5,712,493
[45] Date of Patent: Jan. 27, 1998

[54] DISPLAY DEVICE HAVING DRIVING CIRCUITS AT THE PERIPHERY OF A SUBSTRATE

[75] Inventors: Miki Mori, Yokohama; Chiaki Takubo, Tokyo; Takeshi Sasaki, Chigasaki, all of Japan

[73] Assignee: Kabushiki Kaisha Toshiba, Kawasaki, Japan

[21] Appl. No.: 617,241

[22] Filed: Mar. 18, 1996

[30] Foreign Application Priority Data

Mar. 20, 1995 [JP] Japan .................... 7-059605

[51] Int. Cl.$^6$ .................. G02F 1/1343; G02F 1/137; G02F 1/133; H01L 29/04
[52] U.S. Cl. .................. 257/59; 349/81; 349/58; 349/139; 349/149; 349/152; 349/151; 257/59; 257/72
[58] Field of Search .................. 257/59, 72; 359/54, 359/59, 84, 85, 88; 349/58, 81, 139, 149, 151, 152

[56] References Cited

U.S. PATENT DOCUMENTS

| 5,250,931 | 10/1993 | Misawa et al. | 359/59 |
| 5,402,255 | 3/1995 | Nakanishi et al. | 359/88 |
| 5,452,114 | 9/1995 | Hotta et al. | 359/82 |
| 5,467,210 | 11/1995 | Kishigami | 359/85 |

FOREIGN PATENT DOCUMENTS

| 2-019890 | 1/1990 | Japan . |
| 5-107551 | 4/1993 | Japan . |
| 6-011683 | 1/1994 | Japan . |

*Primary Examiner*—Tom Thomas
*Assistant Examiner*—Fetsum Abraham
*Attorney, Agent, or Firm*—Oblon, Spivak, McClelland, Maier & Neustadt, P.C.

[57] ABSTRACT

A display device comprising a substrate, a rectangular display section provided on the substrate and having four sides, a plurality of driving semiconductor elements formed on peripheral portions of the substrate in the vicinity of the display section, each of the driving semiconductor elements having two opposite long sides and two opposite short sides, one of the two long sides being opposed to one side of the display section, a plurality of output lines extending from the one long side of each of the driving semiconductor elements to the display section, to output signals from the driving semiconductor elements to the display section, a plurality of input lines extending from both the short sides of each of the driving semiconductor elements, to input signals to the driving semiconductor elements to drive them, a plurality of output terminals formed on each of the driving semiconductor elements along both the long sides thereof, and electrically connected to the output lines, the number of the output terminals located along one of the long sides being substantially equal to the number of the output terminals located along the other long side, and a plurality of input terminals formed on each of the driving semiconductor elements along both the short sides thereof, and electrically connected to the input lines.

19 Claims, 7 Drawing Sheets

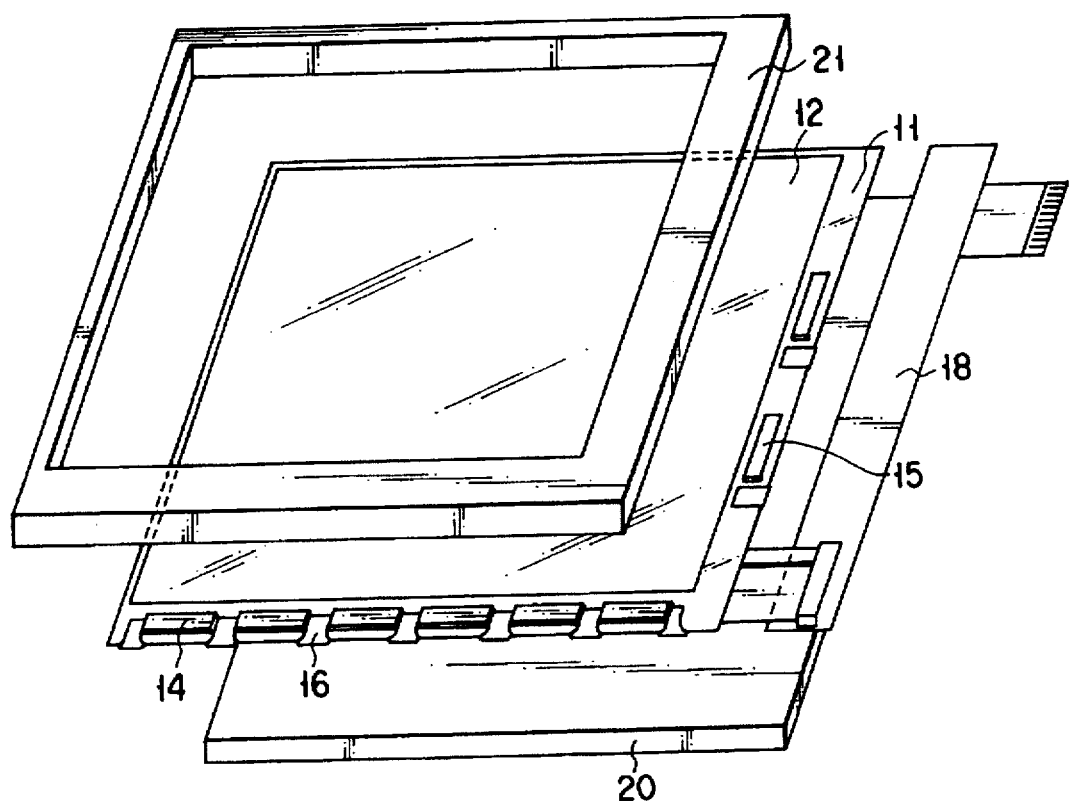
F I G. 1
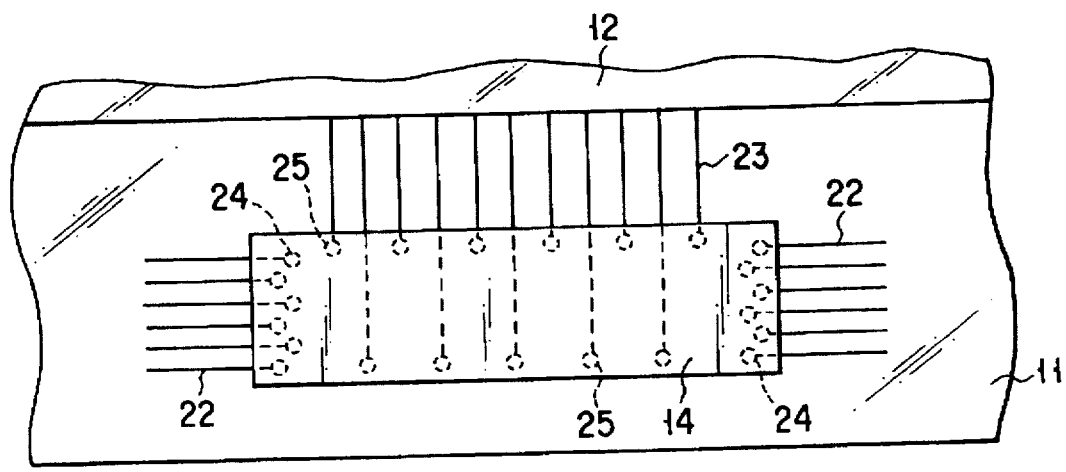
F I G. 3

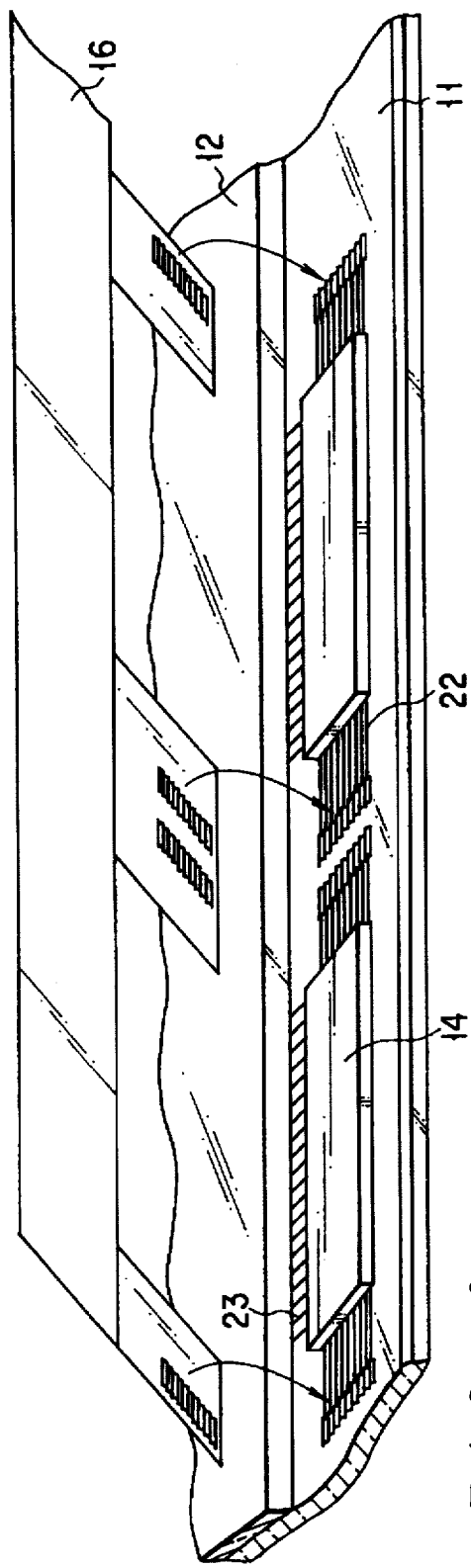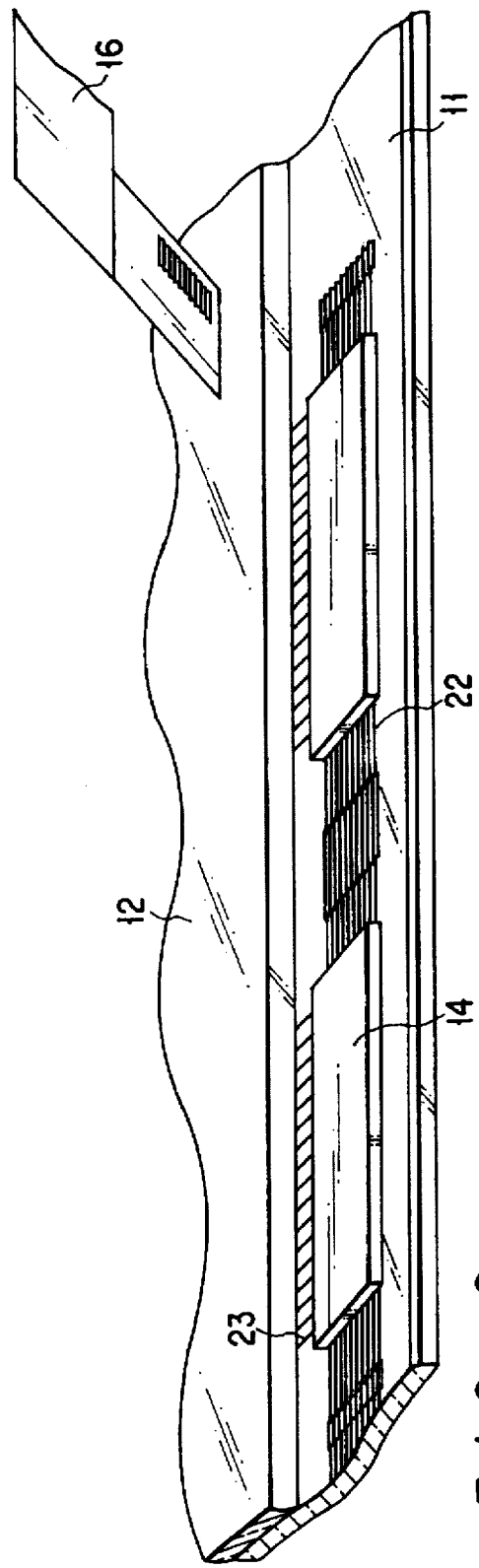
FIG. 2
FIG. 6

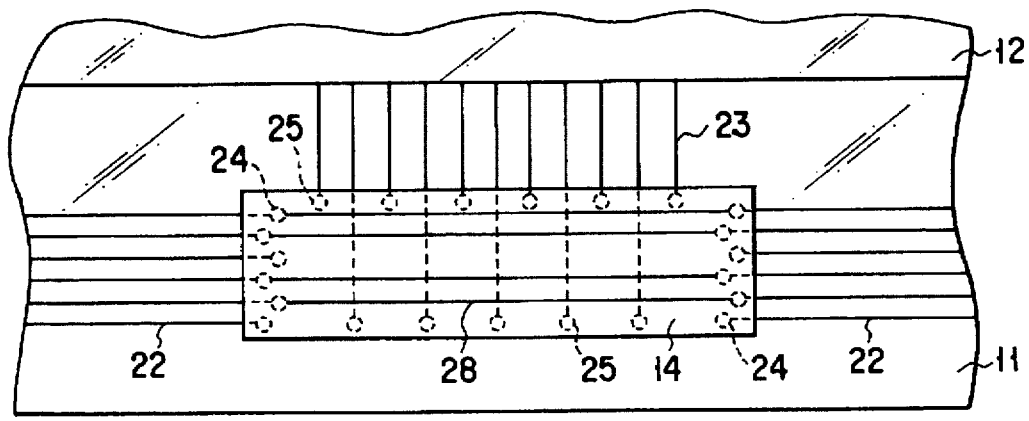
F I G. 7
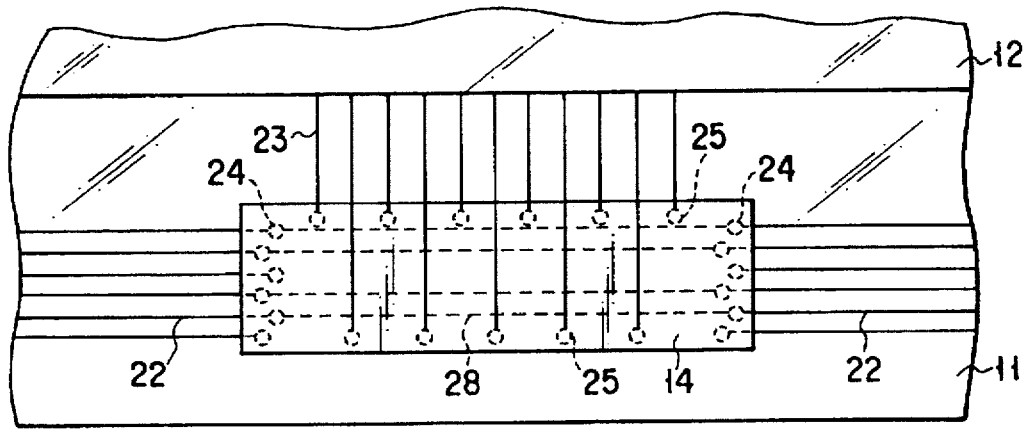
F I G. 8
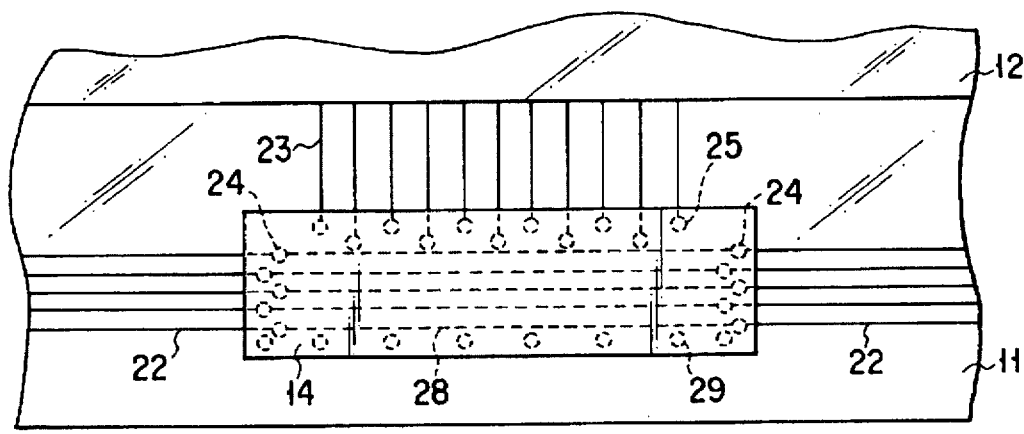
F I G. 9

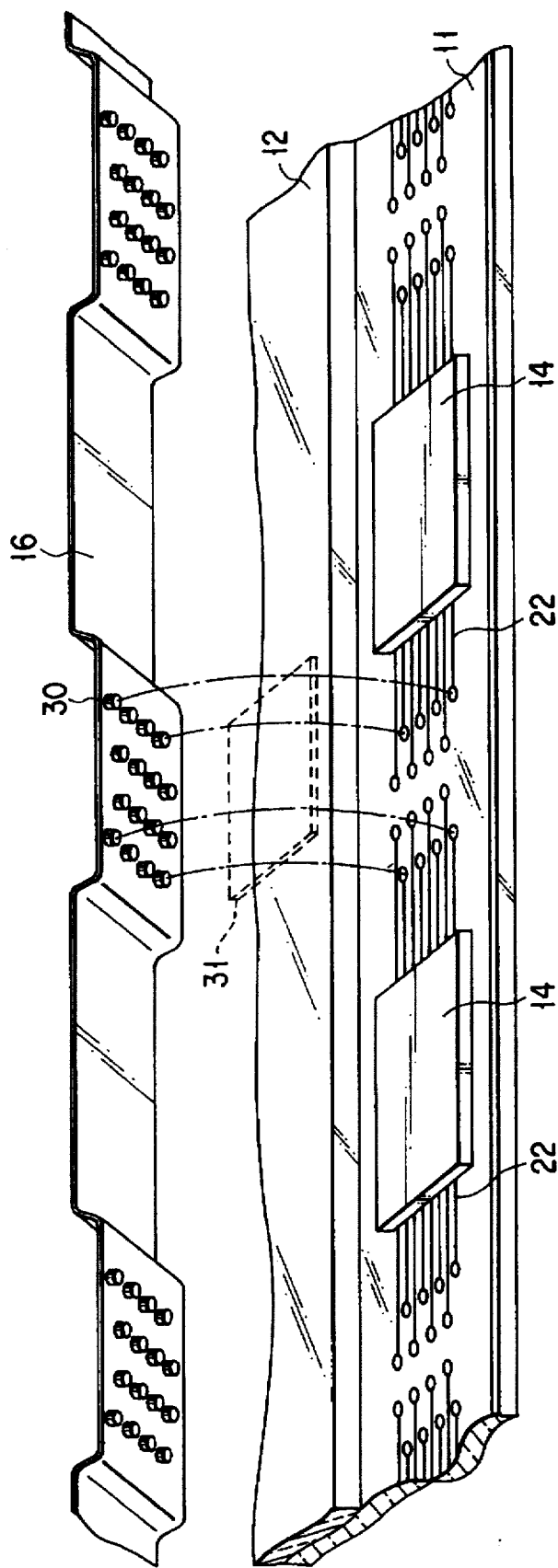
F I G. 14
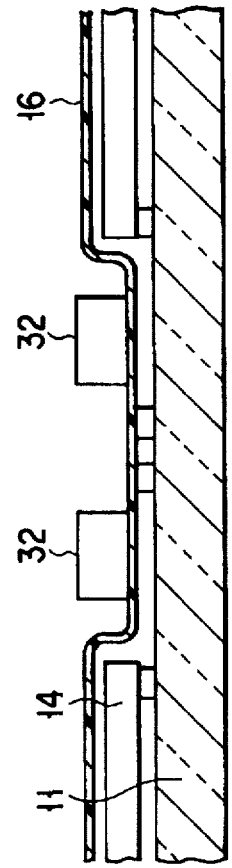
F I G. 15

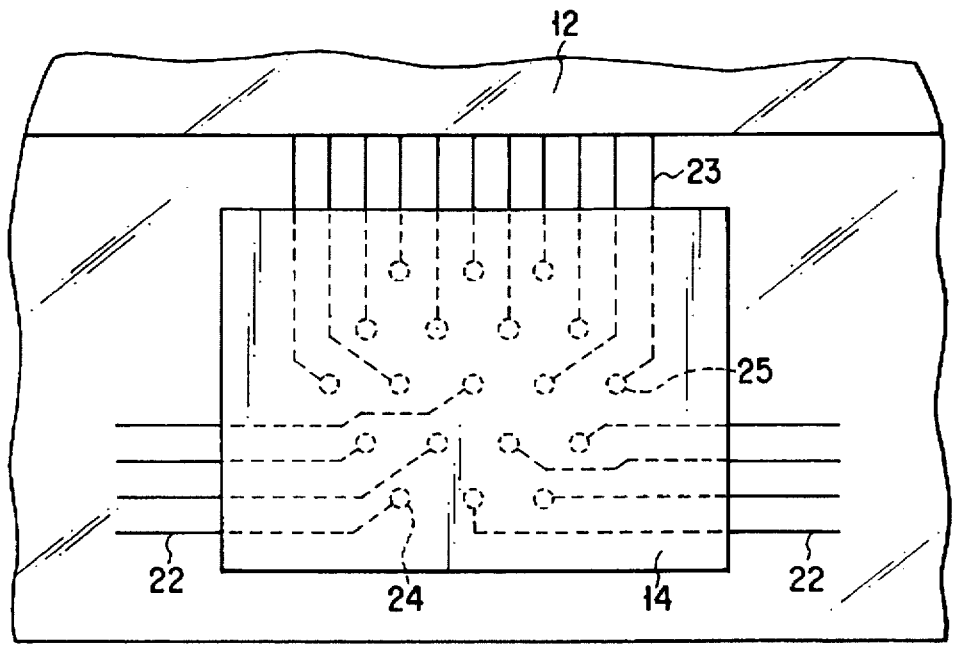
F I G. 16
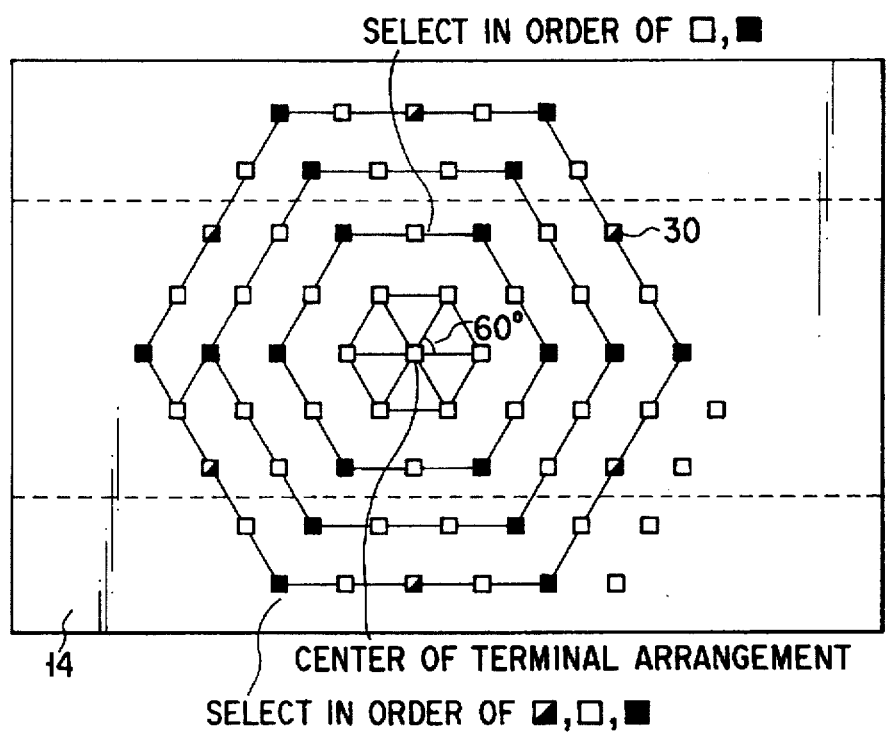
F I G. 17

DISPLAY DEVICE HAVING DRIVING CIRCUITS AT THE PERIPHERY OF A SUBSTRATE

BACKGROUND OF THE INVENTION

1. Field of the Invention

This invention relates to a display device having a substrate on which a display section and semiconductor elements for driving the display section are integrally mounted, and particular to a display device characterized by the arrangement of the terminals of the driving semiconductor elements for driving the display section.

2. Description of the Related Art

There are known display devices such as a liquid display device, a plasma display device, etc., in which pixels are arranged in the form of a matrix and sequentially driven by semiconductor elements for driving the display section (hereinafter, called as driving semiconductor elements). In these display devices, a method for connecting the driving semiconductor elements to lines arranged with a fine pitch has been regarded as important in accordance with the development of microminiaturizing techniques of pixels.

As techniques corresponding to the fine-pitch connection, mounting methods called "COG" (Chip On Glass), "COF" (Chip On Film), etc. have recently been developed. In the case of the COG, driving semiconductor elements (chips) are mounted, by face-down bonding, on wiring lines (traces) formed on a glass substrate, with an projecting electrode interposed therebetween. Similarly, in the case of the COF, the driving semiconductor element is mounted on wiring lines formed on a resin film.

In a typical display device to which the abovementioned mounting methods are applied, a display section is formed on a glass substrate, and a plurality of driving semiconductor elements are arranged on peripheral portions of the substrate in the vicinity of the display section. A multiple of wiring lines for driving the display section extend therefrom, and a plurality of driving semiconductor elements are bonded to the tips of the lines by the face-down bonding. Input lines for driving each driving semiconductor element extend from the side thereof remote from the display section, toward the outside of the substrate, and is connected to a flexible wiring substrate. The flexible wiring substrate is connected to a circuit board with LSIs, etc. mounted thereon.

The driving semiconductor element is in the form of a rectangle having four sides. Output lines for driving the display section extend from that side of the rectangular element which is opposed (i.e. close) to the display section, and from those two sides of the element which extend vertical relative to the display section. Further, input lines for inputting power or signals to the driving semiconductor element to drive them extend from the side thereof remote from the display section. The driving semiconductor element has projecting electrodes formed thereon and serving as output and input terminals connected to the output and input lines, respectively.

Since in the above-described mounting methods, the input terminals are formed along the side of the driving semiconductor element remote from the display section, the peripheral portion of the driving semiconductor element, on which the input lines are formed, is inevitably large. Moreover, since the driving semiconductor elements are simultaneously bonded to the substrate with a multiple of projecting electrodes interposed therebetween, the manufacturing conditions must be controlled very carefully so as to completely bond all connections.

SUMMARY OF THE INVENTION

It is an object of the invention to provide a display device, wherein the arrangement of the terminals of driving semiconductor elements incorporated therein, and the manner of leading the lines of the elements are improved in order to make compact that peripheral portion of a substrate on which the driving elements are mounted.

It is another object of the invention to provide a display device having lines arranged with a very fine pitch.

According to a first aspect of the invention, there is provided a display device comprising:

a substrate;

a rectangular display section provided on the substrate and having four sides;

a plurality of driving semiconductor elements formed on peripheral portions of the substrate in the vicinity of the display section, each of the driving semiconductor elements having two opposite long sides and two opposite short sides, one of the two long sides being opposed to one side of the display section;

a plurality of output lines formed on the substrate extending from the one of the two long sides of each of the driving semiconductor elements to the display section, to output signals from the driving semiconductor elements to the display section;

a plurality of input lines formed on the substrate extending from both the short sides of each of the driving semiconductor elements, to input signals to the driving semiconductor elements to drive them;

a plurality of output terminals formed on each of the driving semiconductor elements along both the long sides thereof, and electrically connected to the output lines, the number of the output terminals located along one of the long sides being substantially equal to the number of the output terminals located along the other of the long sides; and a plurality of input terminals formed on each of the driving semiconductor elements along both the short sides thereof, and electrically connected to the input lines.

Preferably, the output terminals include first output terminals arranged with a predetermined pitch along the one of the long sides, and second output terminals arranged with the same pitch as the first output terminals along the other of the long sides, each of the first output terminals being displaced by ½ of the predetermined pitch from an opposite position to a corresponding one of the second output terminals, in an arrangement direction of the first output terminals.

In this case, the output lines include: a plurality of first output lines which respectively connect, to the display section, the first output terminals arranged on each of the driving semiconductor elements along the one of the long sides thereof opposed to the display section; and a plurality of second output lines which respectively connect, to the display section, the second output terminals arranged on each of the driving semiconductor elements along the other of the long sides thereof; the first and second output lines being alternately arranged in a region defined between the display section and the one of the long sides of each of the driving semiconductor elements.

The display device may further comprise a plurality of testing terminals provided on the substrate along the other of the long sides of each of the driving semiconductor elements and respectively connected to the first and second output terminals.

The input lines extend parallel to the long sides from the input terminals arranged on each of the semiconductor elements along the short sides thereof, to the outside of each of the driving semiconductor elements, so as to prevent an extension of the mounting area outward the substrate.

The output and input terminals are formed of projecting electrodes connected to the output and input lines, respectively.

The input terminals arranged on each of the driving semiconductor elements along the short sides thereof may include at least one pair of terminals opposed and connected to each other in each of the driving semiconductor elements. This enables an input signal used commonly between the driving semiconductor elements to be supplied to the adjacent driving semiconductor elements through the lines formed thereon.

According to a second aspect of the invention, there is provided a display device comprising:

a substrate;

a rectangular display section provided on the substrate and having four sides;

a plurality of driving semiconductor elements formed on peripheral portions of the substrate in the vicinity of the display section, each of the driving semiconductor elements having two opposite long sides and two opposite short sides, one of the two long sides being opposed to one side of the display section;

a plurality of output lines extending from the one long side of each of the driving semiconductor elements to the display section, to output signals from the driving semiconductor elements to the display section;

a plurality of input lines extending from both the short sides of each of the driving semiconductor elements, to input signals to the driving semiconductor elements to drive them;

a plurality of output terminals formed on each of the driving semiconductor elements along the one of the long sides thereof, and electrically connected to the output lines;

a plurality of dummy terminals formed on each of the driving semiconductor elements along the other of the long sides thereof; and a plurality of input terminals formed on each of the driving semiconductor elements along both the short sides thereof, and electrically connected to the input lines.

Preferably, the output terminals are arranged in at least two rows along the one of the long sides, the output terminals included in each of the two rows being arranged with a predetermined pitch, and each of the output terminals included in one of the two rows being displaced from a corresponding one of the output terminals included in the other of the two rows in a direction of the rows.

In this case, the output lines extend below each of the driving semiconductor elements in a staggered manner, thereby connecting the display section to the output terminals.

The input lines extend parallel to the long sides from the input terminals arranged on each of the semiconductor elements along the short sides thereof, to the outside of each of the driving semiconductor elements.

The output and input terminals are formed of projecting electrodes connected to the output and input lines, respectively.

The input terminals arranged on each of the driving semiconductor elements along the short sides thereof may include at least one pair of terminals opposed and connected to each other in each of the driving semiconductor elements.

According to a third aspect of the invention, there is provided a display device comprising:

a substrate;

a rectangular display section provided on the substrate and having four sides;

a plurality of driving semiconductor elements formed on peripheral portions of the substrate in the vicinity of the display section, each of the driving semiconductor elements having two opposite long sides and two opposite short sides, one of the two long sides being opposed to one side of the display section;

a plurality of output lines formed on the substrate for outputting signals from the driving semiconductor elements to the display section;

a plurality of input lines formed on the substrate for inputting signals to the driving semiconductor elements to drive them; and a plurality of terminals arranged substantially symmetrical with respect to a line which passes the center of gravity of each of the driving semiconductor elements and extends parallel to the short sides, the terminals including output terminals selectively connected to the output lines and input terminals selectively connected to the input lines.

The terminals are arranged on the vertexes of at least one regular hexagon which is formed using, as its center, the center of gravity of each of the driving semiconductor elements.

Where two or more regular hexagons are defined, these regular hexagons are concentric with each other and have their corresponding sides parallel to each other.

The distance between those corresponding vertexes of each adjacent pair of the two or more regular hexagons is set identical to the length of one side of a reference regular triangle which is one of six regular triangles constituting a minimum one of the regular hexagons.

Each of the regular hexagons which surround the minimum regular hexagon includes at least one of the terminals on at least one of the six sides thereof, and the at least one of the terminals is positioned on a vertex of the reference regular triangle which is a part of the regular hexagon.

The output and input terminals are formed of projecting electrodes connected to the output and input lines, respectively.

The input lines extend outside the driving semiconductor elements and parallel thereto.

According to this invention, there is provided a semiconductor element for a display device comprising:

a rectangular semiconductor chip having two opposite long sides and two opposite short sides;

a plurality of output terminals formed on the chip along both the long sides thereof, the number of the output terminals located along one of the long sides being substantially equal to the number of the output terminals located along the other of the long sides; and a plurality of input terminals formed on the chip along both the short sides thereof, wherein the output terminals include first output terminals arranged with a predetermined pitch along the one of the long sides, and second output terminals arranged with the same pitch as the first output terminals along the other of the long sides, each of the first output terminals being displaced by ½ of the predetermined pitch from an opposite position to a corresponding one of the second output terminals in an arrangement direction of the first output terminals.

As described above, the invention is characterized in that each rectangular driving semiconductor element with long sides and short sides is arranged such that one of the long sides is opposed to the display section, output lines for driving the display section are led from the long sides, and input lines for inputting power and a signal to the driving semiconductor element to drive the same are connected to the short sides.

Since in this structure, the other long side of the semiconductor element is free from input lines for driving the element, that part of a peripheral portion which is necessary for the input lines in the conventional structure can be removed. Thus, the peripheral portion can be made compact.

Providing output terminals for driving the display section also along the long side opposed to the display section enables even lines arranged with a very fine pitch to be connected to the terminals in a reliable manner. Further, evenly providing the output terminals along both the long sides more enhances the reliability of connection, since load is uniformly applied to the bumps through which the driving semiconductor elements are connected to the substrate at a time.

Moreover, since there are no driving input terminals along the long side opposed to the display section, part of the display section or terminals for testing the driving semiconductor elements can be mounted on the portion of the substrate along that long side, thereby increasing the degree of freedom of wiring design.

In addition, providing some of the terminals on a semiconductor element-forming area enables the production of a very sophisticated display device. If in this case, the terminals are positioned to form concentric regular hexagons using, as their center, the center of gravity of the driving semiconductor element (chip), the number of the terminals can be maximum. This arrangement is desirable also to realize a uniform distribution of load applied to projecting electrodes (bumps) at the time of their connection, and to protect the connections from thermal stress during use.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a schematic perspective view, showing a display device according to a first embodiment of the invention;

FIG. 2 is an enlarged perspective view, showing a driving semiconductor section of the display device of FIG. 1;

FIG. 3 is an enlarged plan view, showing a driving semiconductor section of the display device of FIG. 1;

FIG. 6 is an enlarged perspective view, showing a driving semiconductor section of the display device of FIG. 5;

FIG. 7 is an enlarged plan view, showing a driving semiconductor section of the display device of FIG. 5;

FIG. 8 is an enlarged plan view, showing a driving semiconductor section of a modification of the display device of FIG. 5;

FIG. 9 is an enlarged plan view, showing a driving semiconductor section of another modification of the display device of FIG. 5;

FIG. 14 is a schematic perspective view, useful in explaining the bonding method of FIG. 12 in more detail;

FIG. 15 is a cross sectional view of a semiconductor element-mounting portion according to a modification of the third embodiment, showing chip components mounted on a flexible substrate;

FIG. 16 is an enlarged plan view of a driving semiconductor section of a display device according to a fifth embodiment, showing the terminal arrangement of each element; and FIG. 17 is a view, useful in explaining a method for arranging the terminals of the driving semiconductor element in relation to the fifth embodiment.

DETAILED DESCRIPTION OF THE PREFERRED EMBODIMENTS

Figure 4:
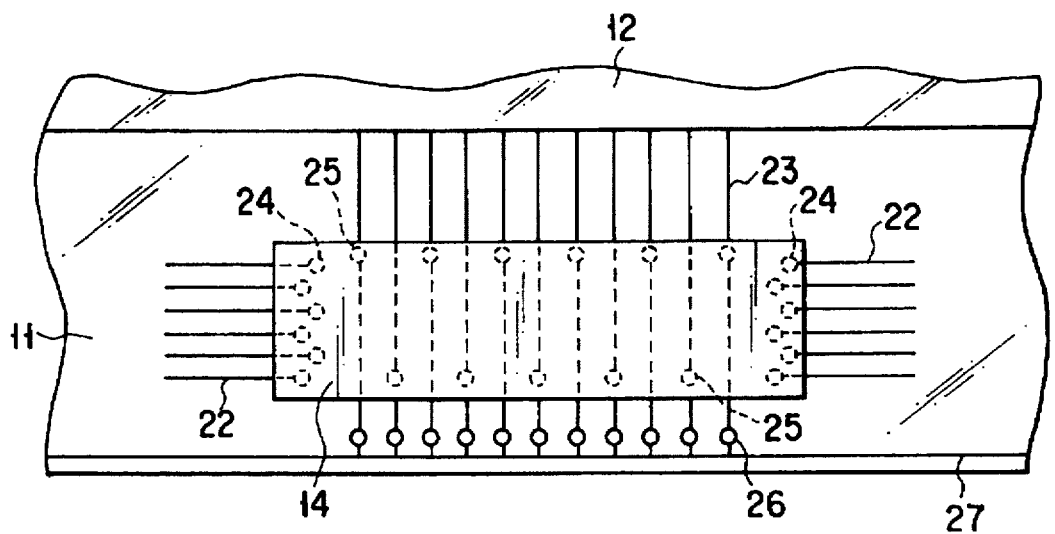
FIG. 4 is an enlarged plan view, showing a driving semiconductor section of a modification of the display device of FIG. 1.

The embodiments of the invention will be explained in detail with reference to the accompanying drawings.

(Embodiment 1)

FIG. 1 is a schematic view, showing a first embodiment of the invention. In this embodiment, explanation will be given of a liquid crystal display device as an example of the display device.

In the liquid crystal display device employed in the embodiment, a display section 12 consisting of a liquid cell is formed on a glass substrate 11, and driving semiconductor elements (chips) 14 and 15 for driving the display device are mounted on that peripheral portion of the substrate 11 which is in the vicinity of the display section 12. A flexible substrate 16 for supplying power or an input signal to the driving semiconductor elements 14 and 15 to drive them is connected to input lines bonded to the short sides of the elements 14 and 15. The flexible substrate 16 receives the input signal and the power from another flexible substrate 18 located outside and connected thereto at a peripheral portion of the glass substrate 11. The glass substrate 11 is covered with frames 20 and 21 for protecting the periphery of the display section 12 and the driving semiconductor elements 14 and 15.

FIG. 2 is an enlarged view of a driving semiconductor section of the display device. Each driving semiconductor element 14 is in the form of a rectangle with two long sides and two short sides, and is mounted on the substrate 11 such that one of the long sides is opposed to the display section 12. Input lines 22 are connected to the two short sides of each driving semiconductor element 14 to drive the element. Further, output lines 23 for outputting a signal to the display section 12 extend from that long side of the element 14 which is opposed to the display section 12. Output terminals and input terminals are formed on the element 14 along the long sides and the short sides, respectively, and are connected, by face-down bonding, to the output lines and input lines, respectively, via projecting electrodes (bumps).

Thus, no input terminals are formed on the element 14 along the long side remote from the display section 12, and no input lines extend therefrom. This enables the area required for a driving semiconductor section (a peripheral portion of the substrate) to be reduced. So as to make compact the peripheral portion of the substrate, each input line 22 extends from a corresponding one of the short sides of the semiconductor element 14 in a direction parallel to the long side of the same, i.e. the line 22 extends straight along the display section 12. Each semiconductor element 14 is connected to an output element via the flexible substrate 16.

The input and output lines can be formed in the same process as the display section 12, or in a different process. Further, the lines can be formed in a general thin film process or plating process.

To connect the driving semiconductor elements 14 and 15 to the lines on the glass substrate 11, a metal bump may be formed on each terminal of the elements, and connected to a corresponding line on the glass substrate by means of solid-phase diffusion or anisotropic conductive film. For example, the line on the glass substrate is generally formed of aluminum or ITO (Indium Tin Oxide). In this case, a bump made of gold is formed on each electrode of the semiconductor elements, and connected to the aluminum line by the solid-phase diffusion.

The input lines 22 may be connected to the flexible substrate 16 by means of an anisotropic conductive adhesive 31 (which will be explained later with reference to FIG. 16). Alternatively, to connect them, projecting terminals may be formed on the flexible substrate 16 and pressure-welded to the input lines 22. The flexible substrate 18 may be bent at an end portion of the glass substrate 11.

FIG. 3 is an enlarged view, showing each driving semiconductor element 14 and its vicinity. As is shown in FIG. 3, the input lines 22 are connected to the input terminals 24 by means of the bumps at both the short sides of the semiconductor element 14. Further, the output lines 23 are connected to the output terminals 25 by means of the bumps at both the long sides of the semiconductor element 14. The output lines 23 are alternately connected to close ones and remote ones of the output terminals 25 arranged in a staggered manner along both the long sides. This arrangement enables the line pitch to be reduced, with the result that higher density lines can be connected to the driving semiconductor element 14 than in the case where all output lines are connected to the element 14 only along the long side close to the display section 12. Although in this case, the resistances of the long and short output lines slightly differ from each other, such a slight difference will raise no problem in driving the display device.

As explained above, the staggered arrangement of the output lines also enables the pad area for each output terminal to be increased, resulting in enhancement of the reliability of the output lines.

Moreover, the staggered arrangement of the output terminals in equal numbers on both the long sides will show a uniform load distribution when the terminals are connected to the lines at a time, which enhances the reliability of connection. To this end, it is preferable to arrange the input terminals also in equal numbers on both the short sides. Arranging the terminals as uniformly as possible along the overall periphery of the driving semiconductor element enables the load applied at the time of connection to be more balanced. To uniformly arrange the terminals, it is desirable to arrange the terminals such that the center of gravity of the combination of the driving semiconductor element and all the terminals is substantially identical to that of the element.

Furthermore, in the case of the staggered arrangement, a shift register incorporated in the driving semiconductor element can be controlled such that an output signal is alternately supplied to the close and remote ones of the output lines.

FIG. 4 shows an example, in which the display device further has testing terminals and a short ring mounted on the driving semiconductor element in the vicinity of the long side remote from the display section.

Each output line 23 extending to the display section 12 also extends to a side opposite to the display section 12 via the output terminal 25 connected thereto. On the side opposite to the display section 12, the output line 23 is connected to a corresponding one of the testing terminals 26 and also to the short ring 27. The short ring 27 is formed to prevent electrostatic discharge breakdown of transistors (not shown) incorporated in the display section 12, and is removed after the completion of the display section.

The above structure enables the driving semiconductor element 14 to be tested by bringing a probe into contact with the testing terminals 26. In addition, since the testing terminals 26 are directly connected to the display section 12, the line connection state, etc. of the display section can be tested, too.

(Second Embodiment)

A display device according to a second embodiment of the invention will now be explained. In the second embodiment, the corresponding input terminals of the driving semiconductor elements are connected to each other through input lines. In this embodiment, elements similar to those in the first embodiment are denoted by corresponding reference numerals, and no detailed explanation is given thereof.

Figure 5:
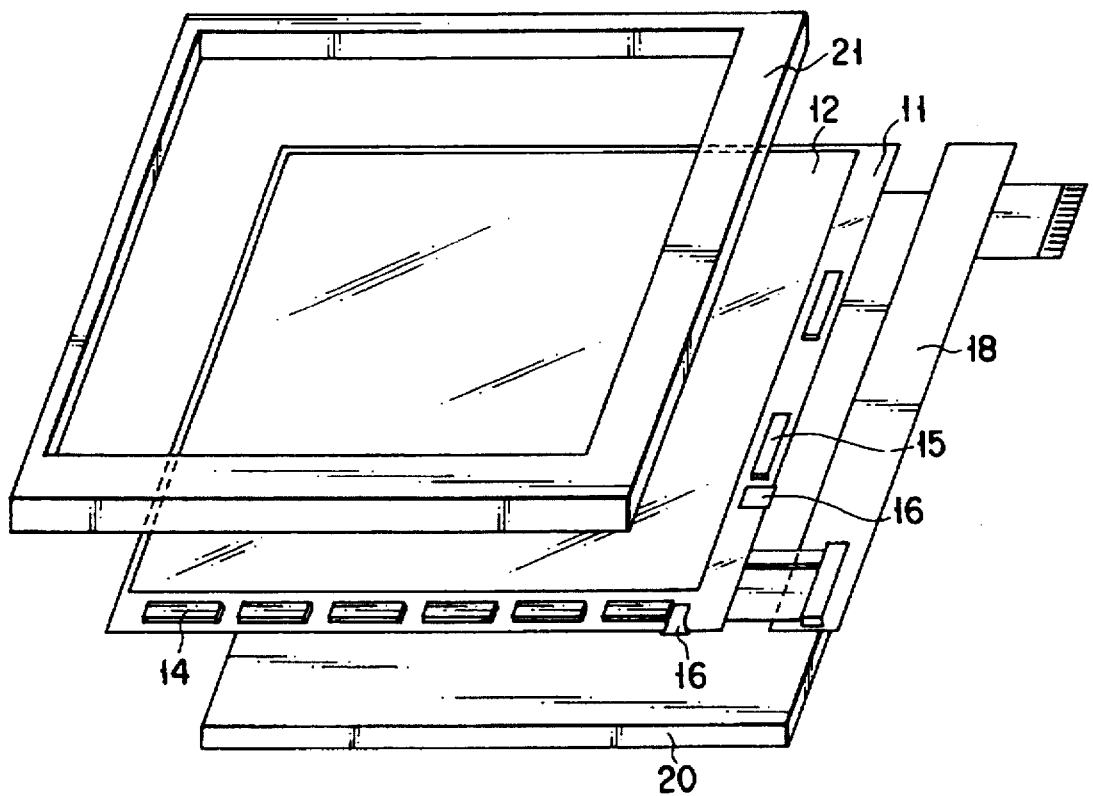
FIG. 5 is a schematic perspective view, showing a display device according to a second embodiment of the invention.

FIG. 5 is a schematic view, showing the second embodiment. As is shown in FIG. 5, a display section 12 consisting of a plurality of liquid crystal cells are formed on a glass substrate 11, and driving semiconductor elements 14 and 15 for driving the display device are mounted on that peripheral portion of the substrate 11 which is in the vicinity of the display section 12. Input terminals of the driving semiconductor elements 14 and 15 are formed on both the short sides thereof and opposing terminals of the adjacent semiconductor elements are connected to each other through input lines formed on the substrate. In this case, on the surface of each of the driving semiconductor elements, wiring lines are formed to connect those opposing terminals to each other, which are located on both the short sides of the driving semiconductor elements. All the corresponding input terminals of the driving semiconductor elements are connected to each other through the wiring lines formed on the element surface and the input lines formed on the substrate surface between adjacent ones of the driving semiconductor elements. A flexible substrate 16 for supplying power or an input signal to the driving semiconductor elements 14 and 15 to drive them is connected only to the short sides of most right-hand one of the driving semiconductor elements. All the driving semiconductor elements can be driven by the input signal and the power supplied from the flexible substrate 16 through the outermost driving element. The flexible substrate 16 receives the input signal and the power from another flexible substrate 18 located outside and connected thereto at a peripheral portion of the glass substrate 11. The glass substrate 11 is covered with frames 20 and 21 for protecting the periphery of the display section 12 and the driving semiconductor elements 14 and 15.

FIG. 6 is an enlarged view of a driving semiconductor section of the display device. Each driving semiconductor element 14 is in the form of a rectangle with two long sides and two short sides, and is mounted on the device 11 such that one of the long sides is opposed to the display section 12. Input lines 22 are connected to the two short sides of each driving semiconductor element 14 to drive the element. Further, the input lines are connected to each other between adjacent ones of the driving semiconductor elements. Output lines 23 for outputting a signal to the display section 12 extend from that long side of the element 14 which is opposed to the display section 12. Output terminals and input terminals are formed on the element 14 along the long sides and the short sides, respectively, and are connected, by face-down bonding, to the output lines and input lines, respectively, via projecting electrodes (bumps).

FIG. 7 is an enlarged view, showing each driving semiconductor element 14 and its vicinity. As is shown in FIG. 7, the input lines 22 are connected to the input terminals 24 by means of the bumps at both the short sides of the semiconductor element 14, and are further extended parallel to the display section 12. Thus, the input lines 22 are connected to each other between adjacent ones of the driving semiconductor elements 14. Wires 28 are provided on the upper surface of the element 14 along the long side, and connect those of the input terminals 24 formed on the element 14, which are opposed to each other along the short side.

The output lines 23 are connected to the output terminals 25 by means of the bumps at both the long sides of the semiconductor element 14. The output lines 23 are connected to the output terminals 25 arranged alternately along both the long sides in a staggered manner.

In the second embodiment, the input signal or the power supplied from the outside through the flexible substrate 18 is input to two lower right ones of the driving semiconductor elements (see FIG. 5) via the flexible substrate 16. The thus-input signal or power is sequentially input to the other driving semiconductor elements 14 via the input lines 22 and the lines 28 formed on the elements 14.

This arrangement enables the number of the connections between the lines 22 and the flexible substrate 16 to be reduced, with the result that the rate of occurrence of a connection defect will decrease and accordingly the reliability of the device increase. In general, each driving semiconductor element has, depending upon its performance, 20–50 connections between the lines and the flexible substrate. The number of the connections of all the driving semiconductor elements may be too large to keep the reliability of connection at high level when they are connected respectively. This embodiment can minimize the number of connections between the lines and the flexible substrate, thereby enhancing the reliability.

In addition, since this embodiment can minimize the number of required flexible substrates, it can reduce the rate of their peeling-off and hence facilitate their handling.

FIG. 8 shows a modification of FIG. 7. The input lines 22 are connected to the input terminals 24 formed on each of the driving semiconductor elements 14 at one short side thereof, and also connected to lines 28 which are provided on the glass substrate 11 and extending to corresponding input terminals 24 at the other short side. As a result, the input lines 22 are connected to the input terminals 24 at the other side. Further, in this case, the input lines 22 are formed in the same layer in the glass substrate 11, and connect adjacent ones of the driving semiconductor elements 14. The output lines 23 are formed below the elements 14, and alternately connected to close ones and remote ones of the output terminals 25 arranged in a staggered manner along both the long sides. Further, the output lines 23 are formed above or below the lines 28 with an insulating layer interposed therebetween, so as to prevent short-circuiting with the lines 28. In other words, it suffices if the lines 23 and 28 constitute a laminated structure.

In the cases of FIGS. 7 and 8, the driving semiconductor elements 14 are connected to each other by means of the lines 28 formed on the upper surface of the glass substrate 11 or on the upper surface of each of the driving semiconductor elements 14. However, the lines connected to the elements 14 may selectively be constituted by the lines 28 or the flexible substrate 16 according to their role. For example, the line for supplying power, whose resistance should be set low, is constituted by the flexible substrate 16, while the line for supplying a data signal, etc. is constituted by the line 28 formed on the upper surface of the driving semiconductor element 14 or of the glass substrate 11. This enables an optimal design of a display device.

FIG. 9 shows another modification of FIG. 7. The input lines 22 are connected to the input terminals 24 formed on each of the driving semiconductor elements 14 at one short side thereof, and extended to corresponding input terminals 24 at the other short side. In this case, the input lines 22 are formed in the same layer in the glass substrate 11, and connect adjacent ones of the driving semiconductor elements 14. The output lines 23 which extend to the display section 12 are connected to the output terminals 25 formed on each of the driving semiconductor elements 14 only along the long side close to the section 12. In this case, the output terminals 25 are arranged in a staggered manner along that long side.

On the other hand, dummy terminals 29 are formed on each element 14 at the other long side remote from the display section 12. In the case of a display device with a small number of pixels, the number of output lines led from its display section is small, and accordingly the number of output terminals formed on each of the driving semiconductor elements 14 may be small. Further, the resistance of an output line is higher when connected to the output terminal remote from the display section 12 than when connected to the output terminal close to the same. In light of this, it is preferable, in establishing low voltage driving, to design such that all the output lines are connected to the output terminals arranged along the long side close to the display section 12 and the dummy terminals 29 are formed along the other long side. This design is free from an increase in line resistance due to an increase in line length, and can realize a uniform load distribution at the time of bonding all the electrodes at a time. As a result, the reliability of connection can be further enhanced.

(Third Embodiment)

Figure 10:
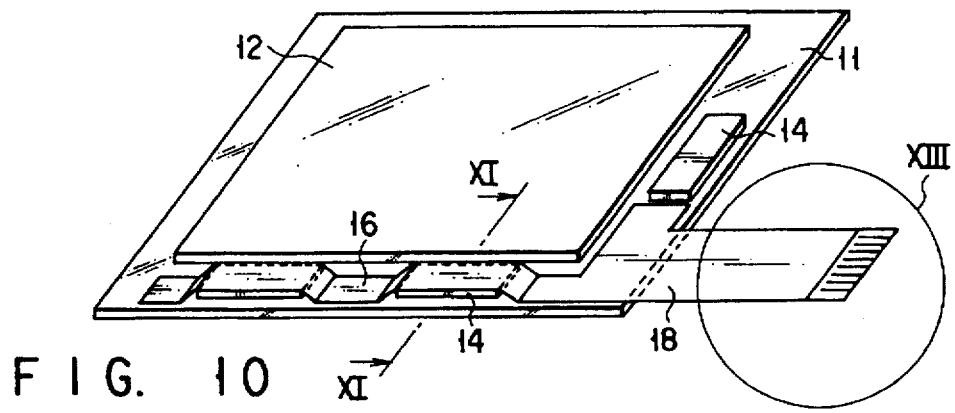
FIG. 10 is a schematic perspective view, showing a display device according to a third embodiment of the invention.

A display device according to a third embodiment of the invention will be explained with reference to FIGS. 10–14. FIG. 10 is a schematic view, showing the third embodiment. As is shown in FIG. 10, a display section 12 is formed on a substrate 11. Further, rectangular driving semiconductor elements 14 are mounted on peripheral portions of the substrate 11 in the vicinity of the display section 12 such that the long sides of each of the driving semiconductor elements 14 are parallel to the sides of the display section 12. The driving semiconductor elements 14 are connected to each other by means of a flexible substrate 16. The flexible substrate 16 is connected to a flexible substrate 18 at an edge portion of the substrate 11.

Figure 12:
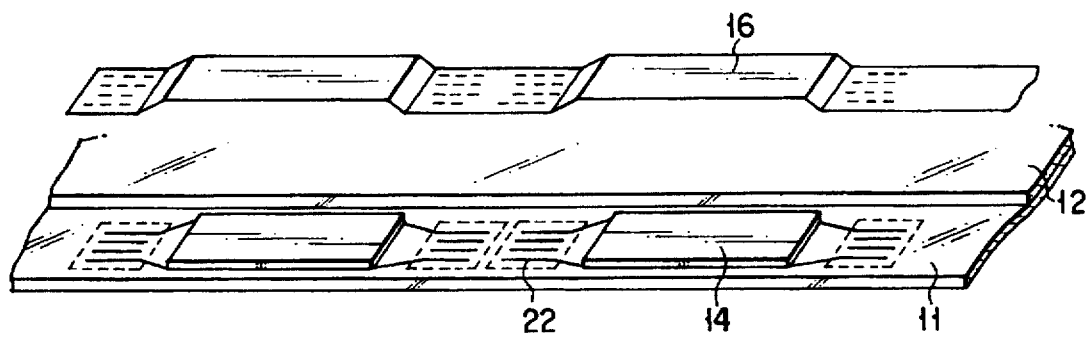
FIG. 12 is a schematic perspective view, useful in explaining a bonding method used in the driving semiconductor element mounting portion of the third embodiment.

As is shown in FIGS. 12 and 14, the flexible substrate 16 is connected to input lines 22 extending from the short sides of the driving semiconductor elements 14, and covers the elements 14. This structure enables a display device with a small edge area to be manufactured. The flexible substrate 16 is connected to the input lines 22 by means of projection electrodes 30 formed on the flexible substrate 16 with an anisotropic conductive adhesive 31.

Figure 11:
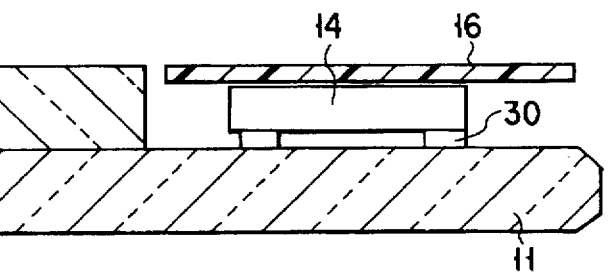
FIG. 11 is a cross sectional view taken along lines XI—XI of FIG. 10.

FIG. 11 is a view taken along lines XI—XI of FIG. 10. The driving semiconductor elements 14 are connected to the substrate 11 by means of the projecting electrodes 30. The flexible substrate which connects the driving semiconductor elements 14 covers the upper surfaces of the elements 14.

Figure 13:
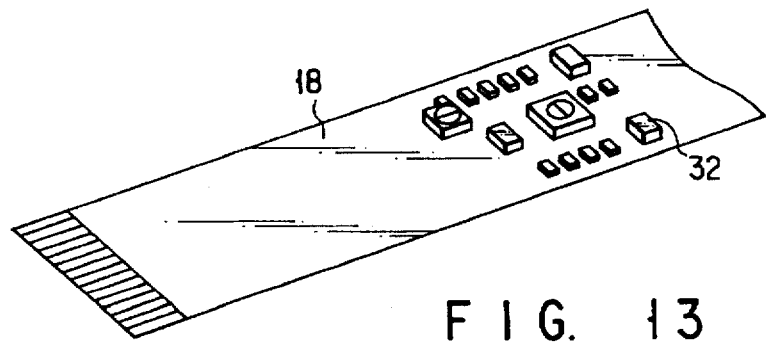
FIG. 13 is an enlarged perspective view, showing a section indicated by XIII in FIG. 12.

FIG. 13 is an enlarged view of a portion indicated by VIII in FIG. 10. Mounting chip components 32 on the flexible substrate 18 as shown in FIG. 10 can reduce the mounting area of the display device. Further, mounting chip components 32 on the flexible substrate 16 as shown in FIG. 15 can reduce the size of the display device.

Although in the FIG. 11 case, the flexible substrate 16 is mounted on the upper surface of the driving semiconductor elements 14, the substrate 16 may be provided outside of an edge portion of the substrate 11 instead of being mounted on the elements 14, and be bent such that it extends on the lower surface of the substrate 11 and is connected to the flexible substrate 18.

(Fourth Embodiment)

A fourth embodiment of the invention will be explained. In this embodiment, a liquid crystal display device of a 10-inch XGA type (the number of pixels is 1024×3×768) was prepared. Since a color filter of longitudinal stripes was employed, the number of pixels arranged on the signal line side is 3072. The length of the signal line side is 8 inches, and hence the pixel pitch on the signal line side is 66 μm. To drive the display device, driving semiconductor elements of 512 outputs were used. Each semiconductor element has a size of 17 mm×2.3 mm.

In this embodiment, the driving semiconductor elements were connected as shown in FIG. 3. If the output terminals 25 are formed on each element 14 only along one long side thereof as shown in FIG. 9, the terminal pitch is 30 μm. In the connection with a pitch of 30 μm, many connection defects occurred, and the driving semiconductor elements 14 could not sufficiently be examined.

Since in the fourth embodiment, the connection method shown in FIG. 3 (where the output terminals are provided along both the two long sides of the driving semiconductor element 14) was employed, the terminal pitch was as large as 60 μm. As a result, the connection can be facilitated, and the yield of products can be increased. Specifically, four rows of output terminals were arranged with a pitch of 120 μm along both the long sides (i.e. two rows of output terminals are arranged in a staggered manner along each long side). Alternatively, 64 output terminals may be arranged with a pitch of 200 μm in the direction of the long side, and 8 output terminals be arranged in the direction of the short side (i.e. four rows of output terminals are arranged in a staggered manner along each long side). In the case of the arrangement of 64×8, some of the output terminals are formed on a semiconductor element forming region of each chip.

The driving semiconductor elements were bonded to the glass substrate by forming gold bumps on the terminals of each of the driving semiconductor elements, forming indium alloy layers on the gold bumps, and pressure-welding them on the glass substrate. The wiring on the glass substrate was made of ITO, which contributes to the connection together with antimony contained in the indium alloy.

In light of further sophistication of the display device and an increase in the number of connection terminals in each driving semiconductor element, there will be a case where terminals must be formed all over the upper surface of the driving semiconductor element. An explanation will now be given of a case where terminals are formed all over the upper surface of the driving semiconductor element.

(Fifth Embodiment)

FIG. 16 is an enlarged view, showing a driving semiconductor element and its vicinity in a display device according to a fifth embodiment. In this embodiment, elements similar to those in the first embodiment are denoted by the corresponding reference numerals, and no detailed explanation will be given thereof. The overall structure of the display device of the fifth embodiment is similar to that shown in FIG. 3. In this embodiment, the terminals are located on the vertexes and the predetermined portions of sides of a hexagon which is virtually formed on the driving semiconductor element (chip) using, as its center, the center of gravity of the chip.

If the driving semiconductor element and the substrate connected thereto have different coefficients of thermal expansion, they repeat thermal expansion and contraction individually. At this time, in the connection portion between the semiconductor element and the substrate (in general, including a sealing resin and projecting electrodes), the boundary of the connection or the internal of each projecting electrode may be cracked because of thermal deformation. The above-described arrangement of the output terminals can restrain the thermal deformation and hence the occurrence of a connection defect.

Referring to FIG. 17, the above arrangement will be explained. In FIG. 17, reference numeral 30 denotes a terminal, and different symbols are used to indicate the priority of the order of arrangement.

In principle, terminals are located sequentially outward from the center of the driving semiconductor element. To ideally reduce the distance between the center and the outermost terminal, the terminals are arranged such that they form a regular hexagon consisting of six regular triangles as shown in FIG. 17. In other words, where the angle formed in the triangle constituted by the center terminal and adjacent ones of terminals on the vertexes of a hexagon is 60°, a highest density arrangement is realized.

The terminals are arranged in the following order:

A first terminal is located at the center of the upper surface of the semiconductor element, and concentric hexagons are set around the first terminal. In accordance with the number of terminals required, a minimum value for n which satisfies the following formula is calculated to determine the number n of hexagons around the first or center terminal:

Number of Terminals <1+3n (n+1); (n=1, 2, 3, . . . )

The number of terminals arranged on each hexagon is 6n (n=1, 2, 3, . . . ). This means that the number of terminals gradually increases from the center terminal toward the outermost hexagon. Specifically, the numbers of terminals are 1, 6, 12, 18, 24, 30, 36 in the order from the center terminal to the outermost hexagon.

Thus, the number of terminals increases as the area of the hexagon defined by the terminals increases. In each hexagon, it is necessary to arrange the terminals in the order starting from the terminal nearest to the center of the terminal arrangement. In other words, this terminal arrangement is characterized in that the terminals of each hexagon are arranged in the order from the terminal nearest to the center of each side of the hexagon to the terminal on each vertex of the same.

Where the semiconductor element is in the form of a rectangle as shown in FIG. 2, some of the terminals arranged according to the above-described rule will inevitably be located outside the element as indicated by the broken line in FIG. 17. In this case, it suffices if the terminals are arranged according to the rule only in the longitudinal direction.

In the field of the display device, refinement of the pixel is being accelerated, and accordingly the number of pixels incorporated in each display device is increasing. In the case of the 10-inch XGA type liquid crystal display device (the number of pixels 1024×3×768), for example, the pixel pitch of the signal line side is 66 µm. In the case of a display device compatible with a PDA (Personal Data Assistance) system or a high vision system, several millions of pixels are arranged with a fine pitch of 40 µm or less. Therefore, a high-power driving semiconductor element is required. If in the driving semiconductor element of 512 outputs for driving the XGA, a single line of terminals are provided on the overall edge portion of each driving semiconductor element, the terminal pitch is 20 µm or less, which will greatly reduce the connection reliability. The terminal pitch can be widened and hence the connection reliability be enhanced by arranging terminals in the manner as described above.

As explained above, high density wiring can be obtained by contriving the terminal arrangement of the driving semiconductor element. Further, such a contrivance enables an useless area to be removed from a peripheral portion of a substrate so as to minimize the size of the substrate.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A display device comprising:

a substrate;

a rectangular display section provided on the substrate and having four sides;

a plurality of driving semiconductor elements formed on peripheral portions of the substrate in the vicinity of the display section, each of the driving semiconductor elements having a first and a second opposite long side and two opposite short sides, the first long side being opposed to one side of the display section;

a first plurality of output terminals formed on a first surface area portion adjacent to the first long side and a second plurality of output terminals formed on a second surface area portion adjacent to the second opposite long side, the first and second plurality of output terminals being substantially equal in number;

a plurality of input terminals formed on third and fourth surface area portions which are, respectively, adjacent to one of the opposition short sides of each of the driving semiconductor elements;

a plurality of output lines formed on the substrate each having one end connected to one of the first and second plurality of output terminals and an opposite end connected to the display section so as to output signals from each of the first and second plurality output terminals to the display section, the plurality of output lines crossing under the first long side; and a plurality of input lines formed on the substrate and connecting the plurality of input terminals on the opposite short sides of the driving semiconductor elements to an input interface area on the substrate, said input interface area being connectable with an exterior signal source to supply input signals to said input terminals on each of the opposite short sides of the driving semiconductor elements, the plurality of input lines crossing under the corresponding opposite short sides.

2. The display device according to claim 1, wherein the first plurality of output terminals are arranged in the first portion with a predetermined pitch and the second plurality of output terminals are arranged in the second portion with the same predetermined pitch, each of the first plurality of output terminals being displaced by ½ of the predetermined pitch relative to a corresponding one of the second plurality of output terminals so that the output lines extend in straight lines from the one end connected to the display section to the end connected to each of the first and second pluralities of output terminals.

3. The display device according to claim 2, wherein the output lines include:

a first plurality of output lines connected to the first plurality of output terminals;

a second plurality of output lines connected with the second plurality of output terminals; and wherein the first and second pluralities of output lines are alternately arranged in at least a region defined between the display section and the first opposite long side of each of the driving semiconductor elements.

4. The display device according to claim 1, further comprising a plurality of testing terminals provided on the substrate adjacent to the second opposite long side of each of the driving semiconductor elements and respectively connected to the first and second pluralities of output terminals.

5. The display device according to claim 1, wherein the plurality of input terminals in the third and fourth portions are formed on respective bottom surface portions of each of the driving semiconductor elements for connection with the plurality of input lines on the substrate which extend parallel to the first and second long sides at least beyond both of the opposite short sides of each of the semiconductor elements.

6. The display device according to claim 1, wherein the pluralities of the output and input terminals are formed as electrodes projecting from the surface of the driving semiconductor elements so as to connect to the pluralities of output and input lines, respectively.

7. The display device according to claim 1, wherein the plurality of input terminals include at least one pair of opposed terminals on each of the driving semiconductor elements which are connected to each other.

8. A display device comprising:

a substrate;

a rectangular display section provided on the substrate and having four sides;

a plurality of driving semiconductor elements formed on peripheral portions of the substrate in the vicinity of the display section, each of the driving semiconductor elements having first and second opposite long sides and two opposite short sides, the first long side of each of the driving semiconductor elements being disposed nearest to one side of the display section;

a plurality of output lines on the substrate, which extend from the first long side of each of the driving semiconductor elements to the display section, to output signals from the driving semiconductor elements to the display section;

a plurality of input lines on the substrate, which extend from both of the short sides of each of the driving semiconductor elements to connect to an input connector for inputting signals to the driving semiconductor elements to drive them;

a plurality of output terminals formed on a first surface area portion adjacent to the first long side of each of the driving semiconductor elements, each said plurality of output terminals being electrically connected to the plurality of output lines;

a plurality of dummy terminals formed on a second portion of a major surface area adjacent to the second long side of each of the driving semiconductor elements;

a plurality of input terminals formed on third and fourth surface area portions, which are, respectively, formed adjacent to one of the short sides of each of the driving semiconductor elements, said plurality of input terminals being electrically connected to the plurality of input lines which are on said substrate; and wherein the plurality of output terminals on each of the driving semiconductor elements are arranged in said first portion in at least two rows with the plurality of output terminals included in each of the at least two rows being arranged with a predetermined pitch, with each of the plurality of output terminals included in one of the at least two rows being displaced from a corresponding one of the plurality of output terminals included in another of the at least two rows in a direction of the at least two rows.

9. The display device according to claim 8, wherein the plurality of output terminals are mounted in the first portion on the bottom surface of the driving semiconductor elements and are electrically connected to the output lines which extend from below each of the driving semiconductor elements in a staggered manner, thereby connecting the display section to the plurality of output terminals.

10. The display device according to claim 8, wherein the plurality of input lines extend in a direction on the substrate parallel to the long sides beyond the short sides of each of the semiconductor elements.

11. The display device according to claim 8, wherein both the plurality of output and input terminals of each of the driving semiconductor elements are formed as electrodes projecting from the surface of the driving semiconductor elements, said projecting electrodes being connected to the pluralities of output and input lines, respectively.

12. The display device according to claim 8, wherein the plurality of input terminals arranged in the third and fourth portions on each of the driving semiconductor elements along the short sides thereof include at least one pair of terminals with one member of the pair in the third portion and one opposed member of the pair in the fourth portion being connected to each other.

13. A display device comprising:

a substrate;

a rectangular display section provided on the substrate and having four sides;

a plurality of driving semiconductor elements formed on peripheral portions of the substrate in the vicinity of the display section, each of the driving semiconductor elements having two opposite long sides and two opposite short sides, one of the two long sides being opposed to one side of the display section;

a plurality of output lines formed on the substrate for outputting signals from the driving semiconductor elements to the display sections;

a plurality of input lines formed on the substrate for inputting signals to the driving semiconductor elements to drive them;

a plurality of terminals arranged substantially symmetrically with respect to a line which passes a center of gravity of each of the driving semiconductor elements and extends parallel to the short sides, the plurality of terminals including output terminals selectively connected to the output lines and input terminals selectively connected to the input lines; and wherein the plurality of terminals on each of the driving semiconductor elements are arranged on vertexes of at least one regular hexagon which is formed using, as its center, the center of gravity of each of the driving semiconductor elements.

14. The display device according to claim 13, wherein at least two regular hexagons are defined which are concentric with each other and have corresponding sides parallel to each other and corresponding aligned vertexes.

15. The display device according to claim 14, wherein a distance between the corresponding aligned vertexes of each of the at least two regular hexagons is set identical to a length of one side of a reference regular triangle which is one of six regular triangles constituting a central one of the at least two concentric regular hexagons.

16. (Amended) The display device according to claim 15, wherein each of the regular hexagons which surround the central regular hexagon includes at least one terminal mounted at a vertex aligned with a vertex of the central regular hexagon.

17. The display device according to claim 13, wherein the output and input terminals are formed as electrodes projecting from a surface of the driving semiconductor element so as to connect to the output and input lines, respectively.

18. The display device according to claim 13, wherein the input lines extend on the substrate beyond the two short sides of the driving semiconductor elements and parallel to the two long sides of the driving semiconductor elements.

19. A semiconductor element for a display device comprising:

a rectangular semiconductor chip having two opposite long sides and two opposite short sides;

a plurality of output terminals formed on said chip along both the long sides thereof, the number of the output terminals located along one of the long sides being substantially equal to the number of the output terminals located along the other of the long sides; and a plurality of input terminals formed on said chip along both the short sides thereof, wherein the output terminals include first output terminals arranged with a predetermined pitch along the one of the long sides, and second output terminals arranged with the same pitch as the first output terminals along the other of the long sides, each of the first output terminals being displaced by ½ of the predetermined pitch from an opposite position to a corresponding one of the second output terminals in an arrangement direction of the first output terminals.

* * * * *